United States Patent
He et al.

(10) Patent No.: US 9,985,587 B2
(45) Date of Patent: May 29, 2018

(54) SWITCHED MODE CONVERTER WITH VARIABLE COMMON MODE VOLTAGE BUFFER

(71) Applicant: Cirrus Logic International Semiconductor Ltd., Edinburgh (GB)

(72) Inventors: Zhaohui He, Austin, TX (US); Eric J. King, Dripping Springs, TX (US); Siddharth Maru, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days. days.

(21) Appl. No.: 15/168,680

(22) Filed: May 31, 2016

(65) Prior Publication Data
US 2017/0207755 A1    Jul. 20, 2017

Related U.S. Application Data

(60) Provisional application No. 62/279,956, filed on Jan. 18, 2016.

(51) Int. Cl.
*H03F 3/217* (2006.01)
*H03F 1/32* (2006.01)
(Continued)

(52) U.S. Cl.
CPC ............. *H03F 1/32* (2013.01); *H03F 3/183* (2013.01); *H03F 3/217* (2013.01); *H03F 3/2173* (2013.01);
(Continued)

(58) Field of Classification Search
CPC ............. H03F 3/2178; H03F 2200/03; H03F 2200/231; H03F 1/0277; H03F 3/2171;
(Continued)

(56) References Cited

U.S. PATENT DOCUMENTS

| 3,851,269 A | 11/1974 | Szorc |
| 6,348,781 B1 * | 2/2002 | Midya .................. H03F 1/0227 323/222 |

(Continued)

FOREIGN PATENT DOCUMENTS

| EP | 1367704 A2 | 12/2003 |
| GB | 2510395 A | 12/1984 |

(Continued)

OTHER PUBLICATIONS

International Search Report and Written Opinion of the International Searching Authority, International Patent Application No. PCT/US2016/040072, dated Sep. 16, 2016, 10 pages.

(Continued)

*Primary Examiner* — Khanh V Nguyen
(74) *Attorney, Agent, or Firm* — Jackson Walker L.L.P.

(57) ABSTRACT

A switching power stage for producing a load voltage at a load output of the switching power stage, wherein the load output comprises a first load terminal having a first load voltage and a second load terminal having a second load voltage such that the load voltage comprises a difference between the first and the second load voltages, that may include: a power converter comprising a power inductor and a plurality of switches, wherein the power converter is configured to drive a power converter output terminal; a linear amplifier configured to drive a linear amplifier output terminal; and a controller for controlling the plurality of switches and the linear amplifier in order to generate the load voltage as a function of an input signal to the controller such that energy delivered to the load output is supplied predominantly by the power converter.

42 Claims, 7 Drawing Sheets

(51) Int. Cl.
   *H03F 3/183*   (2006.01)
   *H03F 3/45*    (2006.01)
   *H04R 3/00*    (2006.01)
   *H03F 1/02*        (2006.01)

(52) U.S. Cl.
   CPC ........... *H03F 3/45076* (2013.01); *H04R 3/00* (2013.01); *H03F 1/0211* (2013.01); *H03F 1/0227* (2013.01); *H03F 2200/03* (2013.01); *H03F 2203/45034* (2013.01); *H04R 2420/03* (2013.01)

(58) Field of Classification Search
   CPC ........ H03F 1/083; H03F 3/217; H03F 3/2173; H03F 2200/372; G05F 1/575; H02M 3/158
   USPC .............................................. 330/251, 207 A
   See application file for complete search history.

(56) References Cited

U.S. PATENT DOCUMENTS

| | | | |
|---|---|---|---|
| 6,617,908 B1 | 9/2003 | Thomsen et al. | |
| 6,727,752 B2 * | 4/2004 | Skinner | H03F 3/2173 330/251 |
| 7,084,799 B1 | 8/2006 | Butler | |
| 7,265,524 B2 * | 9/2007 | Jordan | H02M 3/158 323/225 |
| 7,466,194 B2 * | 12/2008 | Mazda | H03F 3/2173 330/251 |
| 8,242,847 B1 | 8/2012 | Leong et al. | |
| 8,638,168 B1 | 1/2014 | Signoff et al. | |
| 8,773,196 B2 | 7/2014 | Delano | |
| 9,088,211 B2 * | 7/2015 | Ivanov | H02M 3/1582 |
| 9,628,033 B2 | 4/2017 | King et al. | |
| 9,647,611 B1 | 5/2017 | Embar et al. | |
| 2003/0122615 A1 | 7/2003 | Zeff | |
| 2003/0222713 A1 | 12/2003 | Skinner et al. | |
| 2004/0169552 A1 | 9/2004 | Butler | |
| 2005/0083115 A1 | 4/2005 | Risbo | |
| 2007/0229332 A1 | 10/2007 | Tsividis | |
| 2008/0111622 A1 | 5/2008 | Sperlich et al. | |
| 2008/0310046 A1 | 12/2008 | Menegoli et al. | |
| 2009/0027247 A1 | 1/2009 | Kumamoto et al. | |
| 2009/0212859 A1 | 8/2009 | Lesso et al. | |
| 2010/0214024 A1 | 8/2010 | Jones et al. | |
| 2010/0237941 A1 | 9/2010 | Goldfarb et al. | |
| 2012/0306575 A1 | 12/2012 | Shah et al. | |
| 2014/0028395 A1 | 1/2014 | Chan et al. | |
| 2015/0071464 A1 | 3/2015 | Du et al. | |
| 2015/0222184 A1 * | 8/2015 | Melanson | H02M 3/158 323/271 |
| 2015/0323947 A1 | 11/2015 | Amadi et al. | |
| 2016/0056707 A1 | 2/2016 | Wong et al. | |
| 2017/0207755 A1 | 7/2017 | He et al. | |
| 2017/0207759 A1 | 7/2017 | He et al. | |
| 2017/0271996 A1 | 9/2017 | King et al. | |
| 2017/0272043 A1 | 9/2017 | King et al. | |
| 2017/0272044 A1 | 9/2017 | Melanson et al. | |

FOREIGN PATENT DOCUMENTS

| | | |
|---|---|---|
| GB | 2546576 A | 7/2017 |
| GB | 2548443 A | 9/2017 |
| JP | S59224905 A | 12/1984 |
| WO | 98/57422 A1 | 12/1998 |
| WO | 2007136800 A2 | 11/2007 |
| WO | 2017127353 A1 | 8/2014 |
| WO | 2017127132 A1 | 7/2017 |
| WO | 2017160520 A1 | 9/2017 |
| WO | 2017160522 A1 | 9/2017 |
| WO | 2017160556 A1 | 9/2017 |

OTHER PUBLICATIONS

Combined Search and Examination Report under Sections 17 and 18(3) of the UKIPO, Application No. GB1701269.1, dated Jul. 7, 2017.
Eynde, Frank O. On the relationship between the CMRR or PSRR and the second harmonic distortion of differential input amplifiers, IEEE Journal of Solid-State Circuits, Volume: 24, Issue: 6, Dec. 1989, pp. 1740-1744.
Combined Search Report and Written Opinion, GB Application No. 1617096.1, dated Apr. 7, 2017.
Search Report, GB Application No. 1619679.2, dated Apr. 28, 2017.
International Search Report and Written Opinion of the International Searching Authority, International Patent Application No. PCT/US2017/020927, dated May 26, 2017.
International Search Report and Written Opinion of the International Searching Authority, International Patent Application No. PCT/US2017/021351, dated May 26, 2017.
International Search Report and Written Opinion of the International Searching Authority, International Patent Application No. PCT/US2017/013756, dated May 30, 2017.
Combined Search and Examination Report under Sections 17 and 18(3) of the UKIPO, Application No. GB1703492.7, dated Aug. 31, 2017.
Combined Search and Examination Report under Sections 17 and 18(3) of the UKIPO, Application No. GB1703865.4, dated Aug. 31, 2017.
International Search Report and Written Opinion of the International Searching Authority, International Application No. PCT/US2017/020911, dated Nov. 7, 2017.

* cited by examiner

SWITCHED MODE CONVERTER WITH VARIABLE COMMON MODE VOLTAGE BUFFER

RELATED APPLICATIONS

The present disclosure claims priority to U.S. Provisional Patent Application Ser. No. 62/279,956, filed Jan. 18, 2016, which is incorporated by reference herein in its entirety.

FIELD OF DISCLOSURE

The present disclosure relates in general to circuits for audio devices, including without limitation personal audio devices such as wireless telephones and media players, and more specifically, to a switched mode amplifier including a switched mode converter for driving an audio transducer of an audio device.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a speaker driver including a power amplifier for driving an audio output signal to headphones or speakers.

SUMMARY

In accordance with the teachings of the present disclosure, one or more disadvantages and problems associated with existing approaches to driving an audio output signal to an audio transducer may be reduced or eliminated.

In accordance with embodiments of the present disclosure, a switching power stage for producing a load voltage at a load output of the switching power stage, the load output comprising a first load terminal having a first load voltage and a second load terminal having a second load voltage such that the load voltage comprises a difference between the first load voltage and the second load voltage, may include a power converter comprising a power inductor and a first plurality of switches, wherein the power converter is configured to drive a power converter output terminal coupled to the first load terminal in order to drive the first load terminal, a linear amplifier configured to drive a linear amplifier output terminal coupled to the second load terminal in order to drive the second load terminal, a controller configured to control the first plurality of switches of the power converter and the linear amplifier in order to generate the load voltage as a function of an input signal to the controller such that energy delivered to the load output is supplied predominantly by the power converter.

In accordance with these and other embodiments of the present disclosure, a method may be provided for producing a load voltage at a load output of the switching power stage, the load output comprising a first load terminal having a first load voltage and a second load terminal having a second load voltage such that the load voltage comprises a difference between the first load voltage and the second load voltage, the switching power stage further comprising a power converter comprising a power inductor and a first plurality of switches, wherein the power converter is configured to drive a power converter output terminal coupled to the first load terminal in order to drive the first load terminal, and the switching power stage further comprising a linear amplifier configured to drive a linear amplifier output terminal coupled to the second load terminal in order to drive the second load terminal. The method may include controlling the first plurality of switches of the power converter and the linear amplifier in order to generate the load voltage as a function of an input signal to the controller such that energy delivered to the load output is supplied predominantly by the power converter.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
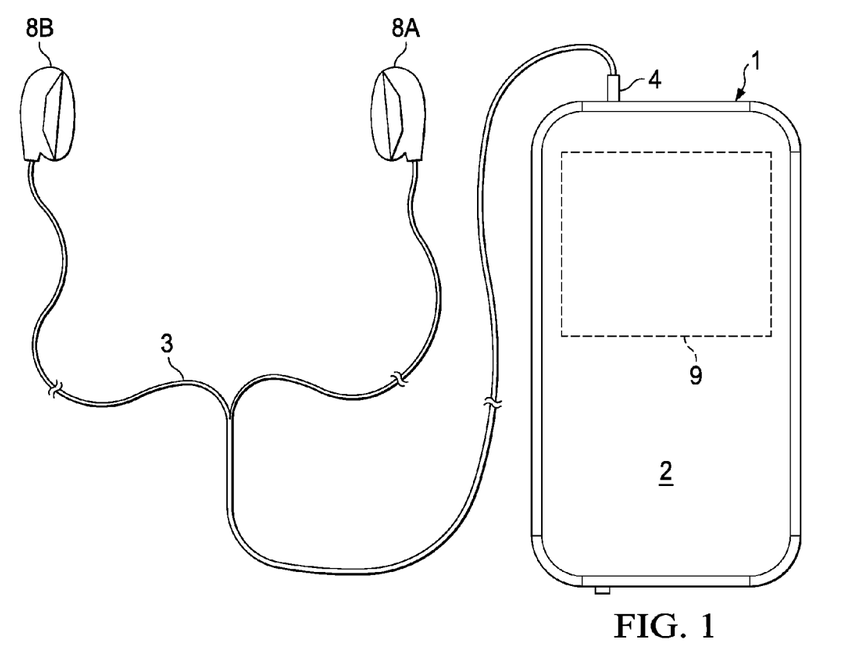
FIG. 1 illustrates an example personal audio device, in accordance with embodiments of the present disclosure.

FIG. 1 illustrates an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
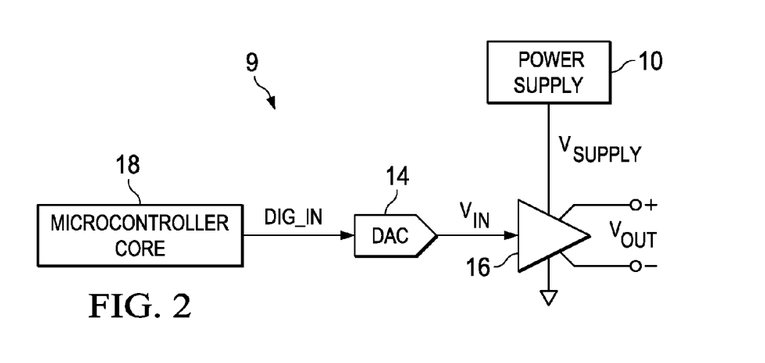
FIG. 2 illustrates a block diagram of selected components of an example audio integrated circuit of a personal audio device, in accordance with embodiments of the present disclosure.

FIG. 2 illustrates a block diagram of selected components of an example audio IC 9 of a personal audio device, in accordance with embodiments of the present disclosure. As shown in FIG. 2, a microcontroller core 18 may supply a digital audio input signal DIG_IN to a digital-to-analog converter (DAC) 14, which may convert the digital audio input signal to an analog signal $V_{IN}$. DAC 14 may supply analog signal $V_{IN}$ to an amplifier 16 which may amplify or attenuate audio input signal $V_{IN}$ to provide a differential audio output signal $V_{OUT}$, which may operate a speaker, a headphone transducer, a line level signal output, and/or other suitable output. In some embodiments, DAC 14 may be an integral component of amplifier 16. A power supply 10 may provide the power supply rail inputs of amplifier 16. In some embodiments, power supply 10 may comprise a battery. Although FIGS. 1 and 2 contemplate that audio IC 9 resides in a personal audio device, systems and methods described herein may also be applied to electrical and electronic systems and devices other than a personal audio device, including audio systems for use in a computing device larger than a personal audio device, an automobile, a building, or other structure.

Figure 3:
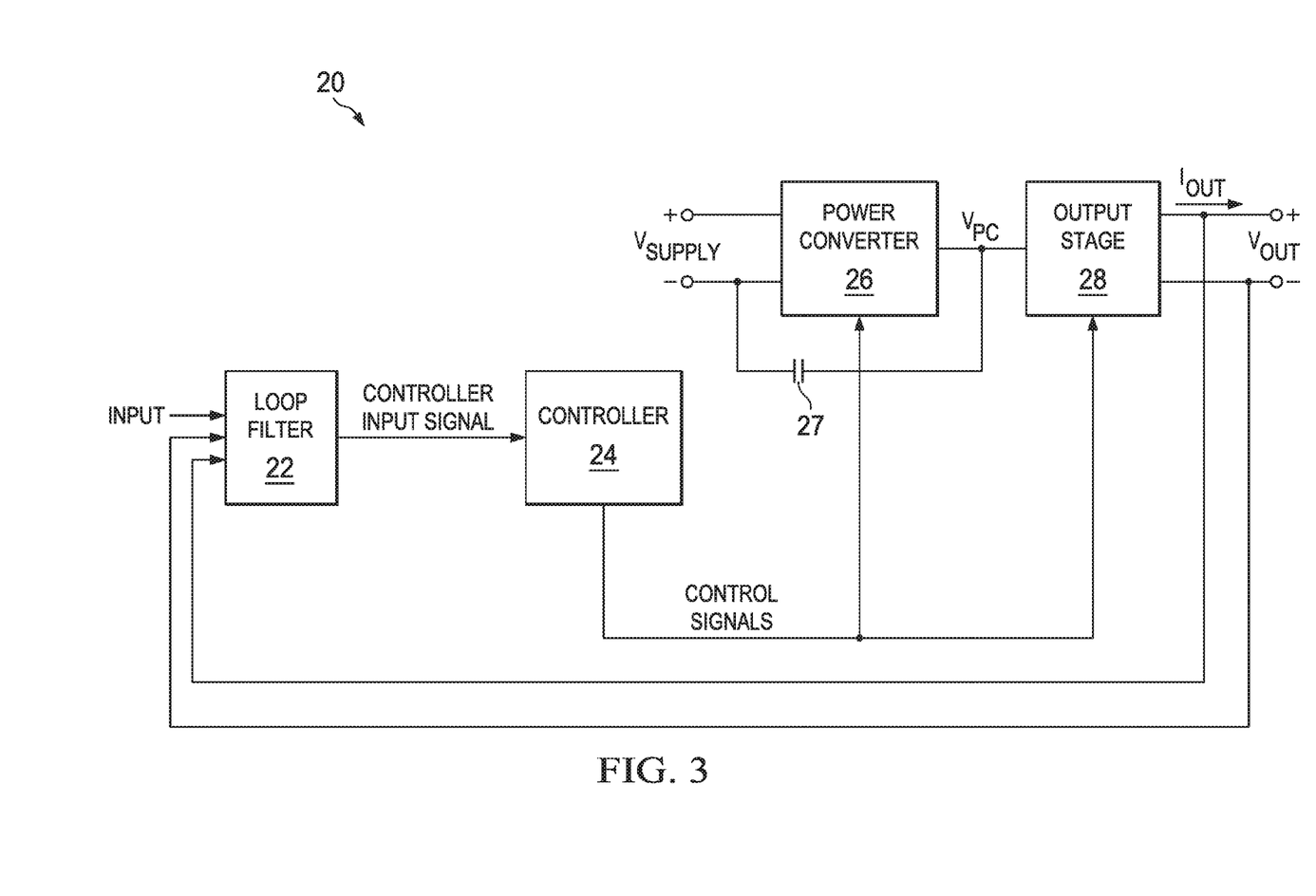
FIG. 3 illustrates a block and circuit diagram of selected components of an example switched mode amplifier, in accordance with embodiments of the present disclosure.

FIG. 3 illustrates a block and circuit diagram of selected components of an example switched mode amplifier 20, in accordance with embodiments of the present disclosure. In some embodiments, switched mode amplifier 20 may implement all or a portion of amplifier 16 described with respect to FIG. 2. As shown in FIG. 3, switched mode amplifier 20 may comprise a loop filter 22, a controller 24, a power converter 26, and an output stage 28.

Loop filter 22 may comprise any system, device, or apparatus configured to receive an input signal (e.g., audio input signal $V_{IN}$ or a derivative thereof) and a feedback signal (e.g., audio output signal $V_{OUT}$, a derivative thereof, or other signal indicative of audio output signal $V_{OUT}$) and based on such input signal and feedback signal, generate a controller input signal to be communicated to converter controller 24. In some embodiments, such controller input signal may comprise a signal indicative of an integrated error between the input signal and the feedback signal. In other embodiments, such controller input signal may comprise a signal indicative of a target current signal to be driven as an output current $I_{OUT}$ or a target voltage signal to be driven as an output voltage $V_{OUT}$ to a load coupled to the output terminals of output stage 28.

Controller 24 may comprise any system, device, or apparatus configured to, based on an input signal (e.g., input signal INPUT), output signal $V_{OUT}$, and/or other characteristics of switched mode amplifier 20, control switching of switches integral to power converter 26, switches integral to output stage 28, and/or one or more linear amplifiers integral to output stage 28, in order to transfer electrical energy from a power supply $V_{SUPPLY}$ to the load of switched-mode amplifier 20 in accordance with the input signal.

Power converter 26 may receive at its input a voltage $V_{SUPPLY}$ (e.g., provided by power supply 10), and may generate at its output a voltage $V_{PC}$. In some embodiments, voltage $V_{SUPPLY}$ may be received via input terminals including a positive input terminal and a negative input terminal which may be coupled to a ground voltage. As described in greater detail in this disclosure (including, without limitation, in reference to FIGS. 4A-4D, below), power converter 26 may comprise a power inductor and a plurality of switches that are controlled by control signals received from controller 24 in order to convert voltage $V_{SUPPLY}$ to voltage $V_{PC}$, such that audio output signal $V_{OUT}$ generated from voltage $V_{PC}$ is a function of the input signal to loop filter 22. Also as shown in FIG. 3, a capacitor 27 may be coupled between a second supply terminal (which may in some embodiments be coupled to ground) and the power converter output terminal. However, in other embodiments, capacitor 27 may be coupled between a first supply terminal and the power converter output terminal.

Turning briefly to FIGS. 4A-4D, non-limiting examples of single-ended switching mode power supplies which may be used to implement power converter 26 are described.

Figure 4A:
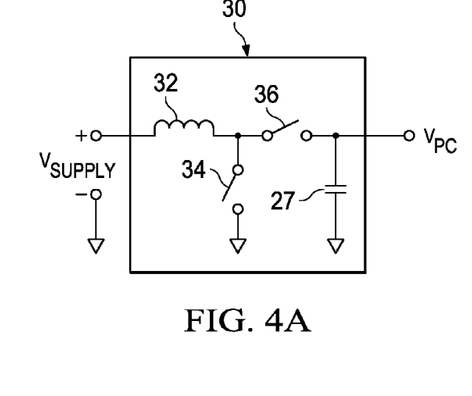
FIG. 4A illustrates a circuit diagram of selected components of an example boost converter that may be used to implement the power converter depicted in FIG. 3, in accordance with embodiments of the present disclosure.

FIG. 4A illustrates a circuit diagram of selected components of an example boost converter 30 that may be used to implement power converter 26 depicted in FIG. 3, in accordance with embodiments of the present disclosure. As shown in FIG. 4A, boost converter 30 may include a power inductor 32, switches 34, 36, and capacitor 27 arranged as shown. In operation, controller 24 may be configured to, when boost converter 30 is used to implement power converter 26, control switches 34 and 36 such that power converter output voltage $V_{PC}$ is a function of the controller input signal provided to controller 24.

Figure 4B:
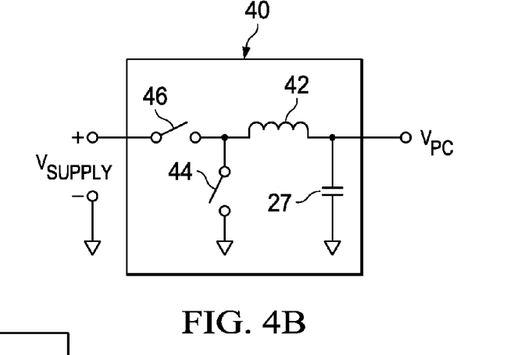
FIG. 4B illustrates a circuit diagram of selected components of an example buck converter that may be used to implement the power converter depicted in FIG. 3, in accordance with embodiments of the present disclosure.

FIG. 4B illustrates a circuit diagram of selected components of an example buck converter 40 that may be used to implement power converter 26 depicted in FIG. 3, in accordance with embodiments of the present disclosure. As shown in FIG. 4B, buck converter 40 may include a power inductor 42, switches 44, 46, and capacitor 27 arranged as shown. In operation, controller 24 may be configured to, when buck converter 40 is used to implement power converter 26, control switches 44 and 46 such that power converter output voltage $V_{PC}$ is a function of the controller input signal provided to controller 24.

Figure 4C:
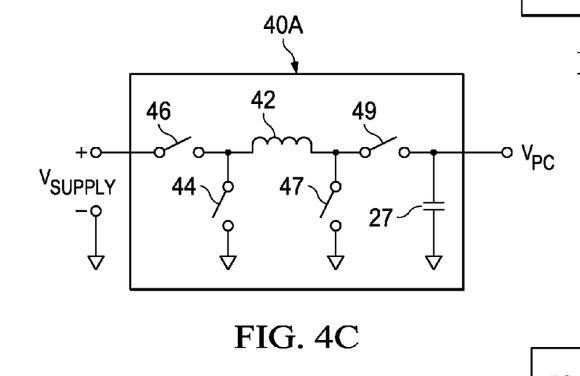
FIG. 4C illustrates a circuit diagram of selected components of another example non-inverting buck-boost converter that may be used to implement the power converter depicted in FIG. 3, in accordance with embodiments of the present disclosure.

FIG. 4C illustrates a circuit diagram of selected components of an example non-inverting buck-boost converter 40A that may be used to implement power converter 26 depicted in FIG. 3, in accordance with embodiments of the present disclosure. As shown in FIG. 4C, buck converter 40A may include a power inductor 42, switches 44, 46, 47, and 49 and capacitor 27 arranged as shown. In operation, controller 24 may be configured to, when non-inverting buck-boost converter 40 is used to implement power converter 26, control switches 44, 46, 47, and 49 such that power converter output voltage $V_{PC}$ is a function of the controller input signal provided to controller 24.

Figure 4D:
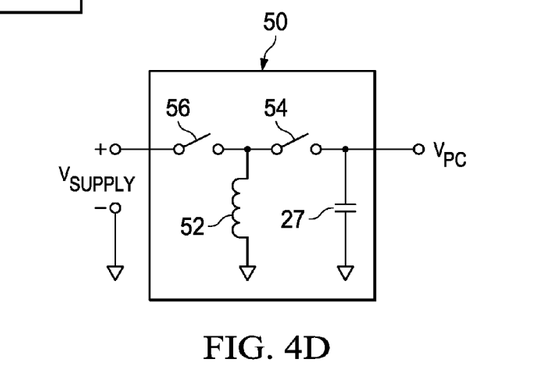
FIG. 4D illustrates a circuit diagram of selected components of an example inverting buck-boost converter that may be used to implement the power converter depicted in FIG. 3, in accordance with embodiments of the present disclosure.

FIG. 4D illustrates a circuit diagram of selected components of an example inverting buck-boost converter 50 that may be used to implement power converter 26 depicted in FIG. 3, in accordance with embodiments of the present disclosure. As shown in FIG. 4D, buck-boost converter 50 may include a power inductor 52, switches 54, 56, and capacitor 27 arranged as shown. In operation, controller 24 may be configured to, when inverting buck-boost converter 50 is used to implement power converter 26, control switches 54 and 56 such that power converter output voltage $V_{PC}$ is a function of the controller input signal provided to controller 24.

Turning again to FIG. 3, output stage 28 may receive at its input the power converter output voltage $V_{PC}$, and may generate at its output a voltage $V_{PC}$. As described in greater detail in this disclosure (including, without limitation, in reference to FIGS. 5A-5E, below), power converter 26 may comprise at least one linear amplifier and, in some embodiments, a plurality of switches, wherein the at least one linear amplifier and the plurality of switches, if present, are controlled by control signals received from controller 24 in order to convert power converter output voltage $V_{PC}$ to audio output signal $V_{OUT}$, such that audio output signal $V_{OUT}$ is a function of the input signal to loop filter 22.

Figure 5A:
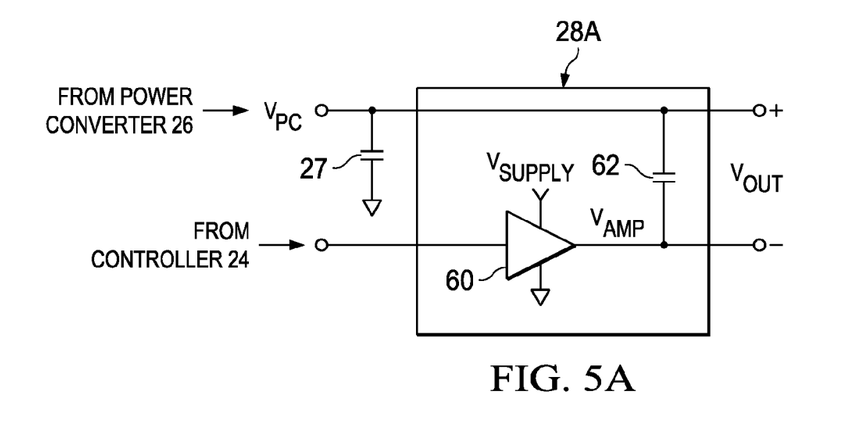
FIG. 5A illustrates a circuit diagram of selected components of an example output stage that may be used to implement the output stage depicted in FIG. 3, in accordance with embodiments of the present disclosure.
Figure 6:
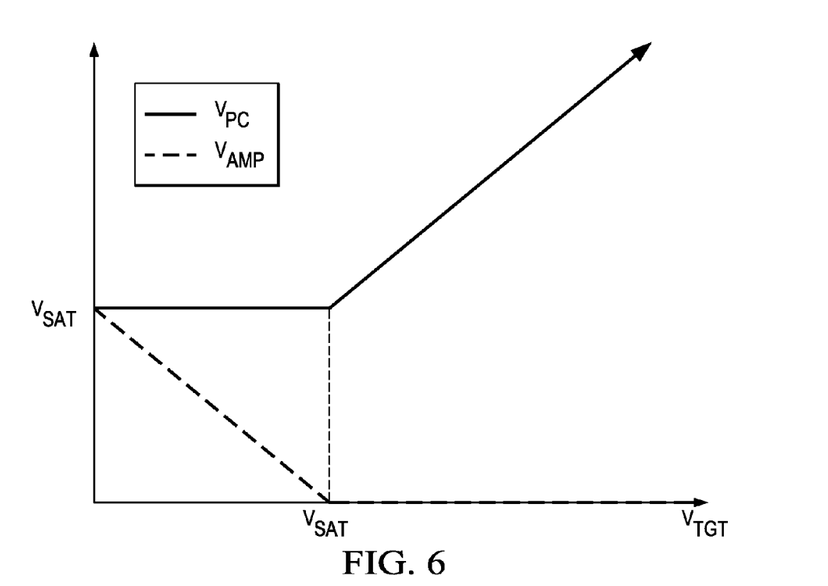
FIG. 6 illustrates a graph depicting the relationship of a voltage driven by the power converter depicted in FIG. 3 and a voltage driven by a linear amplifier of the output stage depicted in FIG. 3 as a function of a desired output voltage, in accordance with embodiments of the present disclosure.

FIG. 5A illustrates a circuit diagram of selected components of an example output stage 28A that may be used to implement output stage 28 depicted in FIG. 3, in accordance with embodiments of the present disclosure. As shown in FIG. 5A, power converter 26 may drive power converter output voltage $V_{PC}$ to a first output terminal of output stage 28A and output stage 28A may include a linear amplifier 60 configured to drive a linear amplifier output voltage $V_{AMP}$ to the second output terminal of output stage 28A, such that audio output signal $V_{OUT}$ is equal to the difference between power converter output voltage $V_{PC}$ and linear amplifier output voltage $V_{AMP}$. In operation, as a magnitude of power converter output voltage $V_{PC}$ approaches zero, power converter 26 may demand a small duty cycle which approaches zero in order to maintain volt-second balance of its power inductor. This small duty cycle may be hard to achieve, thus leading to a lower saturation limit representing a minimum magnitude of voltage $V_{SAT}$ that power converter 26 may be able to practically provide. Accordingly, to provide linearity of audio output signal $V_{OUT}$ as a function of the input signal to controller 24, as power converter output voltage $V_{PC}$ approaches the lower saturation limit, controller 24 may cause linear amplifier 60 to drive a non-zero linear amplifier output voltage $V_{AMP}$ to the second output terminal in order to increase a common mode voltage between the first output terminal and the second output terminal, allowing audio output signal $V_{OUT}$ to approach and cross zero. Above the lower saturation limit, controller 24 may cause linear amplifier 60 to drive a zero or approximately zero linear amplifier output voltage $V_{AMP}$ to the second output terminal such that audio output signal $V_{OUT}$ is equal to power converter output voltage $V_{PC}$. In other words, controller 24 may control power converter 26 and linear amplifier 60 to generate voltages in accordance with the following functions, which are graphically depicted in FIG. 6, and wherein voltage $V_{TGT}$ represents a target or desired voltage to be output as audio output signal $V_{OUT}$ as indicated by the input signal to controller 24:

$$V_{PC} = V_{TGT}; \text{ for } |V_{TGT}| > V_{SAT}$$

$$V_{PC} = V_{SAT}; \text{ for } |V_{TGT}| \leq V_{SAT}$$

$$V_{AMP} = 0; \text{ for } |V_{TGT}| > V_{SAT}$$

$$V_{AMP} = V_{SAT} - V_{TGT}; \text{ for } |V_{TGT}| \leq V_{SAT}$$

In some embodiments, an offset voltage may be added to each of the output of power converter 26 and the output of linear amplifier 60, to ensure that the voltage $V_{AMP} > 0$ at all times.

Accordingly, presence of linear amplifier 60 and its ability to increase the common mode voltage of the output terminals in response to low magnitudes of the output signal $V_{OUT}$ may minimize non-linearities of output signal $V_{OUT}$ as a function of the input signal received by controller 24, and permit crossing a magnitude of zero by audio output signal $V_{OUT}$.

Figure 5B:
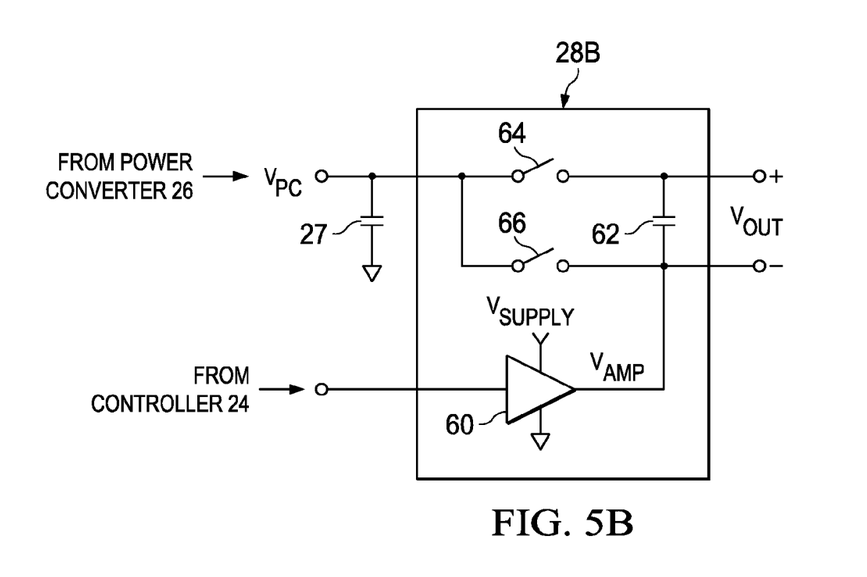
FIG. 5B illustrates a circuit diagram of selected components of another example output stage that may be used to implement the output stage depicted in FIG. 3, in accordance with embodiments of the present disclosure.

FIG. 5B illustrates a circuit diagram of selected components of an example output stage 28B that may be used to implement output stage 28 depicted in FIG. 3, in accordance with embodiments of the present disclosure. As shown in FIG. 5B, power converter 26 may drive power converter output voltage $V_{PC}$. Output stage 28B may comprise a plurality of switches including switch 64 coupled between the power converter output and a first output terminal of output stage 28B and switch 66 coupled between the power converter output and a second output terminal of output stage 28B. In addition, output stage 28B may include a linear amplifier 60 configured to drive a linear amplifier output voltage $V_{AMP}$ to the second output terminal of output stage 28B. As shown in FIG. 5B, output stage 28B may also include a capacitor 62 coupled between the first output terminal and the second output terminal. In some embodiments, capacitor 62 may not be present in switched mode amplifier 20. In other embodiments, capacitor 62 may be present in switched mode amplifier 20 in lieu of or in addition to capacitor 27.

In operation of output stage 28B, controller 24 may activate (e.g., enable, close, turn on) switch 64 and deactivate (e.g., disable, open, turn off) switch 66 for positive values of audio output signal $V_{OUT}$. As in output stage 28A, in output stage 28B, controller 24 may, as power converter output voltage $V_{PC}$ approaches the lower saturation limit, cause linear amplifier 60 to drive a non-zero linear amplifier output voltage $V_{AMP}$ to the second output terminal in order to increase a common mode voltage between the first output terminal and the second output terminal, allowing audio output signal $V_{OUT}$ to approach and cross zero. Above the lower saturation limit, controller 24 may cause linear amplifier 60 to drive a zero linear amplifier output voltage $V_{AMP}$ to the second output terminal such that audio output signal $V_{OUT}$ is equal to power converter output voltage $V_{PC}$.

Figure 5C:
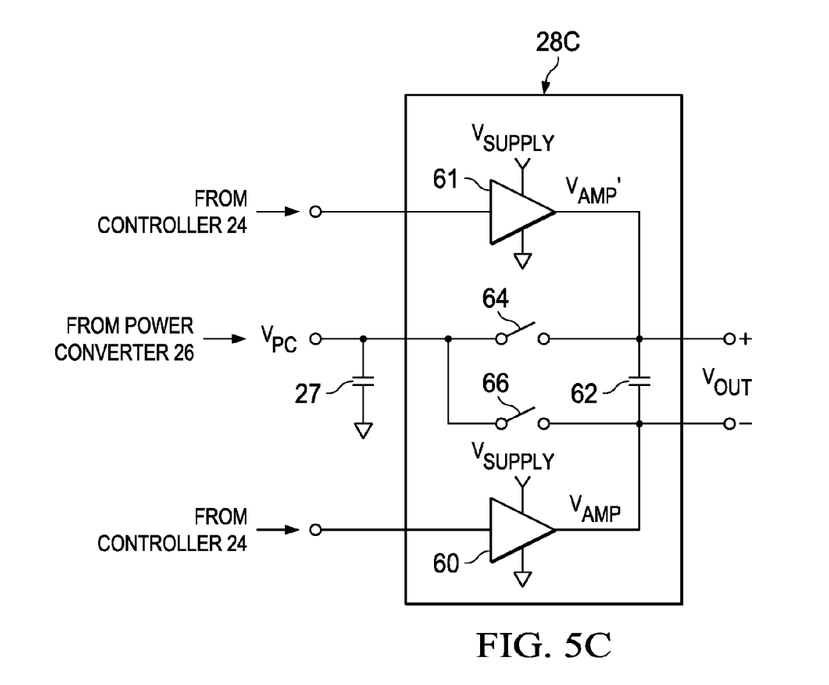
FIG. 5C illustrates a circuit diagram of selected components of another example output stage that may be used to implement the output stage depicted in FIG. 3, in accordance with embodiments of the present disclosure.

FIG. 5C illustrates a circuit diagram of selected components of an example output stage 28C that may be used to implement output stage 28 depicted in FIG. 3, in accordance with embodiments of the present disclosure. Output stage 28C of FIG. 5C may be similar in many respects to output stage 28B of FIG. 5B, and thus, only the main differences between output stage 28C and output stage 28B are discussed in detail. One main difference between output stage 28C and output stage 28B is that output stage 28C may include a linear amplifier 61 configured to drive a second linear amplifier output voltage $V_{AMP}'$ to the first output terminal of output stage 28C. Accordingly, operation of output stage 28C may be similar to that of output stage 28B, except as noted below.

In operation of output stage 28C, controller 24 may activate (e.g., enable, close, turn on) switch 64 and deactivate (e.g., disable, open, turn off) switch 66 for positive values of audio output signal $V_{OUT}$ and activate switch 66 and deactivate switch 64 for negative values of audio output signal $V_{OUT}$. When audio output signal $V_{OUT}$ is positive and as power converter output voltage $V_{PC}$ approaches the lower saturation limit, controller 24 may cause linear amplifier 60 to drive a non-zero linear amplifier output voltage $V_{AMP}$ to the second output terminal in order to increase a common mode voltage between the first output terminal and the second output terminal, allowing audio output signal $V_{OUT}$ to approach and cross zero. Above the lower saturation limit power converter output voltage $V_{PC}$ for positive values of audio output signal $V_{OUT}$, controller 24 may cause linear amplifier 60 to drive a zero or approximately zero linear amplifier output voltage $V_{AMP}$ to the second output terminal such that audio output signal $V_{OUT}$ is equal to power converter output voltage $V_{PC}$. Similarly, when audio output signal $V_{OUT}$ is negative and as power converter output voltage $V_{PC}$ approaches the lower saturation limit, controller 24 may cause linear amplifier 61 to drive a non-zero linear amplifier output voltage $V_{AMP}'$ to the first output terminal in order to increase a common mode voltage between the first output terminal and the second output terminal, allowing audio output signal $V_{OUT}$ to approach and cross zero. Above the lower saturation limit of power converter output voltage $V_{PC}$ for negative values of audio output signal $V_{OUT}$, controller 24 may cause linear amplifier 61 to drive a zero or approximately zero linear amplifier output voltage $V_{AMP}'$ to the first output terminal such that audio output signal $V_{OUT}$ is equal to the inverse of power converter output voltage $V_{PC}$. In addition, controller 24 may be configured such that for positive voltages of audio output signal $V_{OUT}$, it causes linear amplifier 61 to enter a high-impedance mode in which linear amplifier 61 does not drive any output voltage $V_{AMP}'$, and for negative voltages of audio output signal $V_{OUT}$, it causes linear amplifier 60 to enter a high-impedance mode in which linear amplifier 60 does not drive any output voltage $V_{AMP}$. In equation form:

$$V_{PC} = V_{TGT}; \text{ for } |V_{TGT}| > V_{SAT}$$

$$V_{PC} = V_{SAT}; \text{ for } |V_{TGT}| \leq V_{SAT}$$

$$V_{AMP} = 0; \text{ for } V_{TGT} > V_{SAT}$$

$$V_{AMP} = V_{SAT} - V_{TGT}; \text{ for } 0 \leq V_{TGT} \leq V_{SAT}$$

$$V_{AMP} = \text{no drive}; \text{ for } V_{TGT} < 0$$

$$V_{AMP}' = 0; \text{ for } V_{TGT} < -V_{SAT}$$

-continued $$V_{AMP}' = V_{SAT} + V_{TGT}; \text{ for } -V_{SAT} \leq V_{TGT} \leq 0$$

$$V_{AMP}' = \text{no drive}; \text{ for } V_{TGT} > 0$$

Figure 5D:
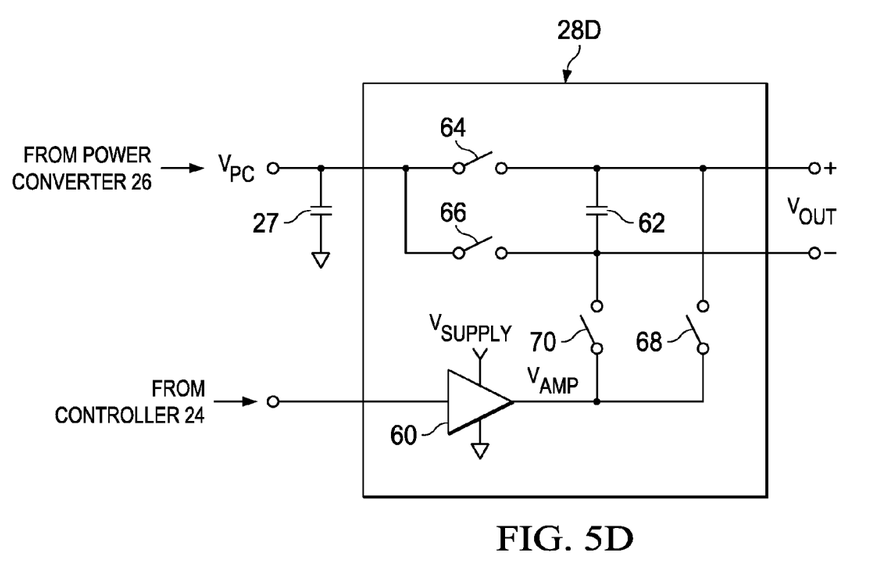
FIG. 5D illustrates a circuit diagram of selected components of another example output stage that may be used to implement the output stage depicted in FIG. 3, in accordance with embodiments of the present disclosure.

FIG. 5D illustrates a circuit diagram of selected components of an example output stage 28D that may be used to implement output stage 28 depicted in FIG. 3, in accordance with embodiments of the present disclosure. Output stage 28D of FIG. 5D may be similar in many respects to output stage 28C of FIG. 5C, and thus, only the main differences between output stage 28D and output stage 28C are discussed in detail. One main difference between output stage 28D and output stage 28C is that output stage 28D may include a single linear amplifier 60 and a plurality of switches including switch 68 coupled between the output of linear amplifier 60 and a first output terminal of output stage 28D and switch 70 coupled between the output of linear amplifier 60 and a second output terminal of output stage 28D.

In operation of output stage 28D, controller 24 may activate switches 64 and 70 and deactivate switches 66 and 68 for positive values of audio output signal $V_{OUT}$ and activate switches 66 and 68 and deactivate switches 64 and 70 for negative values of audio output signal $V_{OUT}$. As in output stage 28B, in output stage 28D, controller 24 may, as power converter output voltage $V_{PC}$ approaches the lower saturation limit, cause linear amplifier 60 to drive a non-zero linear amplifier output voltage $V_{AMP}$ to the second output terminal in order to increase a common mode voltage between the first output terminal and the second output terminal, allowing audio output signal $V_{OUT}$ to approach and cross zero. Above the lower saturation limit of power converter output voltage $V_{PC}$, controller 24 may cause linear amplifier 60 to drive a zero linear amplifier output voltage $V_{AMP}$ to the second output terminal such that audio output signal $V_{OUT}$ is equal to power converter output voltage $V_{PC}$.

Figure 5E:
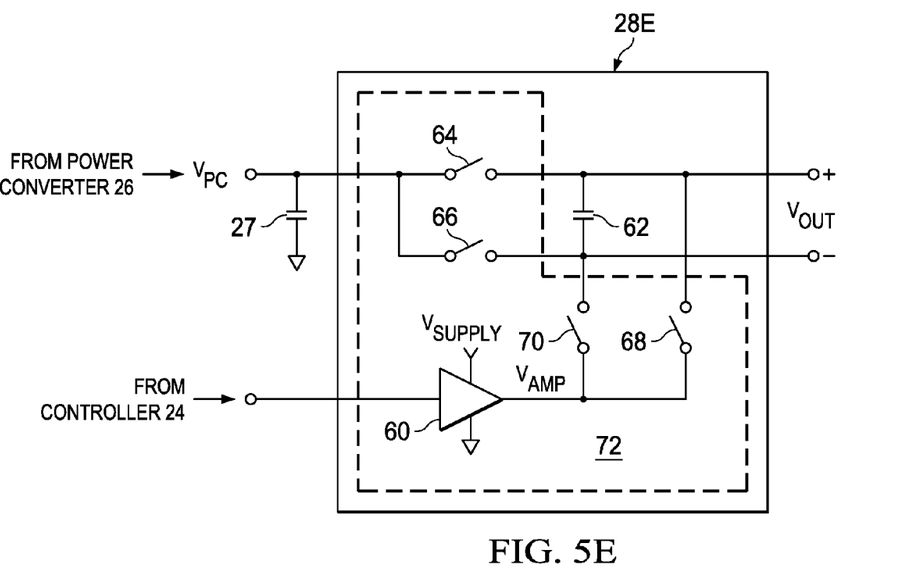
FIG. 5E illustrates a circuit diagram of selected components of another example output stage that may be used to implement the output stage depicted in FIG. 3, in accordance with embodiments of the present disclosure.
Figure 7:
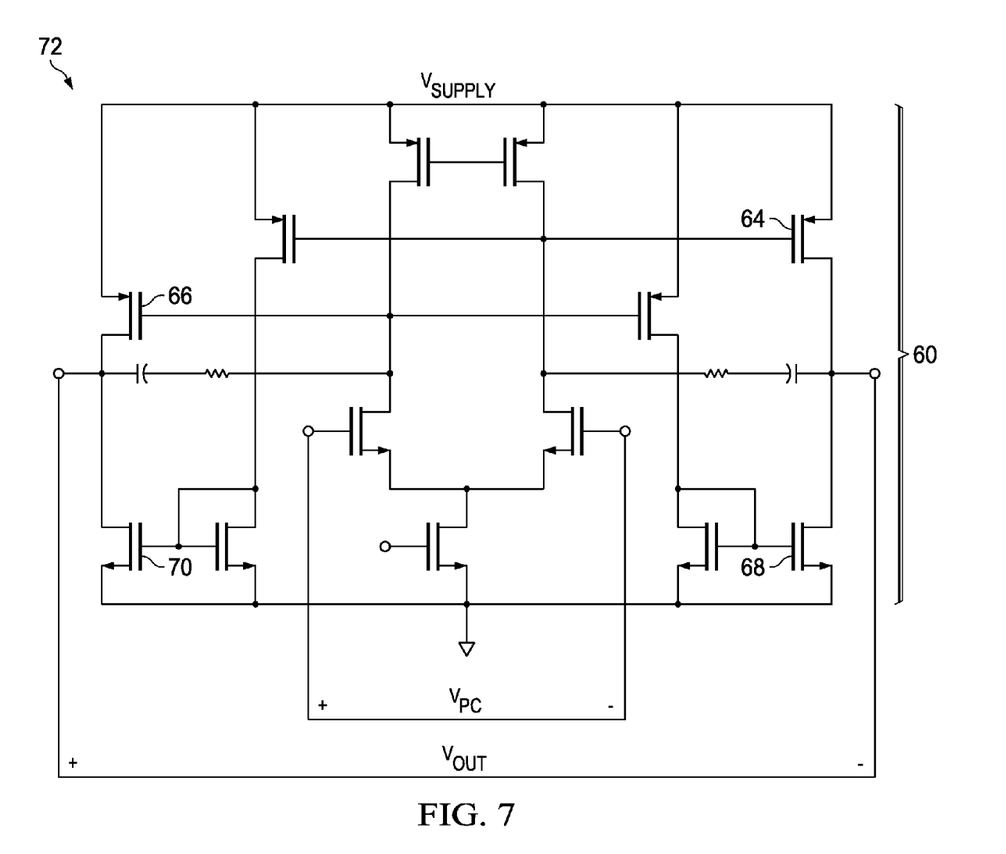
FIG. 7 illustrates a circuit diagram of an example differential amplifier which may be used to implement portions of the example output stage depicted in FIG. 5E, in accordance with embodiments of the present disclosure.

FIG. 5E illustrates a circuit diagram of selected components of an example output stage 28E that may be used to implement output stage 28 depicted in FIG. 3, in accordance with embodiments of the present disclosure. Output stage 28E of FIG. 5E may be similar in many respects to output stage 28D of FIG. 5D, and thus, only the main differences between output stage 28E and output stage 28D are discussed in detail. One main difference between output stage 28E and output stage 28D is that in output stage 28E, linear amplifier 60, switch 64, switch 66, switch 68, and/or switch 70 may be integral to a final output stage of a differential amplifier 72. To further illustrate, FIG. 7 illustrates a circuit diagram of an example two-stage, Miller, differential-input, differential-output operational amplifier 72 with push-pull output (as described in Philip E. Allen et al., *CMOS Analog Circuit Design,* 2d Ed, 387-388 (2002)), which may be used to implement portions of the example output stage depicted in FIG. 5E, in accordance with embodiments of the present disclosure. Further, FIG. 7 depicts transistors of operational amplifier 72 which may be equivalent to switches 64, 66, 68, and 70 of output stage 28E of FIG. 5E. In some embodiments, additional circuitry may be present to cause the gate-to-source voltage of switch 66 and/or 64 to be at or greater than supply voltage(s) in order to operate as a switch (e.g., activate and deactivate). In these and other embodiments, switch 70 and/or 68 may operate in the linear region of such devices, wherein the gate-to-source voltage of such devices is less than the supply voltage.

In the foregoing discussion, embodiments are disclosed in which a capacitor 27 is coupled between the power converter output terminal and one of a first supply terminal having a first voltage and a second supply terminal having a second voltage, and embodiments are disclosed in which a capacitor 62 is coupled between the first load terminal and the second load terminal of switched mode amplifier 20. However, in these and other embodiments, a capacitor may be coupled between the first load terminal of switched mode amplifier 20 and one of the first supply terminal and the second supply terminal. In addition, in these and other embodiments, a capacitor may be coupled between the second load terminal of switched mode amplifier 20 and one of the first supply terminal and the second supply terminal.

As used herein, a "switch" may comprise any suitable device, system, or apparatus for making a connection in an electric circuit when the switch is enabled (e.g., activated, closed, or on) and breaking the connection when the switch is disabled (e.g., deactivated, open, or off) in response to a control signal received by the switch. For purposes of clarity and exposition, control signals for switches described herein are not depicted although such control signals would be present to selectively enable and disable such switches. In some embodiments, a switch may comprise a metal-oxide-semiconductor field-effect transistor (e.g., an n-type metal-oxide-semiconductor field-effect transistor).

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A switching power stage for producing a load voltage at a load output of the switching power stage, the load output comprising a first load terminal having a first load voltage and a second load terminal having a second load voltage such that the load voltage comprises a difference between the first load voltage and the second load voltage, the switching power stage comprising:

a power converter comprising a power inductor and a first plurality of switches, wherein the power converter is configured to drive a power converter output terminal coupled to the first load terminal in order to drive the first load terminal, and wherein the first plurality of switches comprises:
a first switch coupled between a second terminal of the power inductor and the power converter output terminal; and
a second switch coupled between the second terminal of the power inductor and the second supply terminal;
a linear amplifier configured to drive a linear amplifier output terminal coupled to the second load terminal in order to drive the second load terminal;
a capacitor coupled between the first load terminal and one of a first supply terminal having a first voltage and a second supply terminal having a second voltage; and
a controller configured to control the first plurality of switches of the power converter and the linear amplifier in order to generate the load voltage as a function of an input signal to the controller such that energy delivered to the load output is supplied predominantly by the power converter.

2. The switching power stage of claim 1, further comprising a capacitor coupled between the first load terminal and the second load terminal.

3. The switching power stage of claim 1, wherein a second terminal of the power inductor is coupled to the power converter output terminal.

4. The switching power stage of claim 1, wherein the first plurality of switches comprises:
a first switch coupled between a first terminal of the power inductor and a first supply terminal having a first voltage; and
a second switch coupled between the first terminal of the power inductor and a second supply terminal having a second voltage.

5. The switching power stage of claim 4, wherein the first plurality of switches further comprises:
a third switch coupled between a second terminal of the power inductor and the power converter output terminal; and
a fourth switch coupled between the second terminal of the power inductor and the second supply terminal.

6. The switching power stage of claim 1, wherein the controller further controls the first plurality of switches to drive the first load voltage as a function of a target output voltage which is a function of the input signal.

7. The switching power stage of claim 6, wherein the function of the target output voltage includes a magnitude of the target output voltage.

8. The switching power stage of claim 6, wherein the function of the target output voltage includes a lower saturation limit of the power converter output terminal.

9. The switching power stage of claim 6, wherein the controller further controls the linear amplifier to drive a non-zero voltage as the second load voltage in order to increase a common mode voltage of the first load terminal and the second load terminal when the power converter output terminal is driven to the lower saturation limit in order to produce the output voltage as a function of an input signal to the controller while minimizing non-linearities of the output voltage as a function of the input signal.

10. The switching power stage of claim 1, wherein the controller further controls the linear amplifier to drive the second load voltage as a function of a target output voltage which is a function of the input signal.

11. The switching power stage of claim 1, further comprising:
a second plurality of switches, comprising at least a first switch coupled between the power converter output terminal and the first load terminal and a second switch coupled between the power converter output terminal and the second load terminal such that the power converter output terminal and the first load terminal are coupled via the first switch and the power converter output terminal and the second load terminal are coupled via the second switch; and
wherein the controller is configured to control the first plurality of switches, the second plurality of switches, and the linear amplifier in order to generate the load voltage as a function of an input signal to the controller such that energy delivered to the load output is supplied predominantly by the power converter.

12. The switching power stage of claim 11, further comprising a second linear amplifier configured to drive the first load terminal.

13. The switching power stage of claim 12, wherein the controller is further configured to control the linear amplifier and the second linear amplifier such that:
when the linear amplifier drives the second load terminal, the second linear amplifier is prevented from driving the first load terminal; and
when the second linear amplifier drives the first load terminal, the linear amplifier is prevented from driving the second load terminal.

14. The switching power stage of claim 12, wherein the controller further controls the second linear amplifier to drive a non-zero voltage as the first load voltage in order to increase a common mode voltage of the first load terminal and the second load terminal when the voltage of the power converter output terminal is driven to the lower saturation limit in order to produce the output voltage as a function of the input signal while minimizing non-linearities of the output voltage as a function of the input signal.

15. The switching power stage of claim 11, further comprising:
a third plurality of switches, comprising at least a third switch coupled between the linear amplifier output terminal and the first load terminal and a fourth switch coupled between the linear amplifier output terminal and the second load terminal such that the linear amplifier output terminal and the first load terminal are coupled via the third switch and the linear amplifier output terminal and the second load terminal are coupled via the fourth switch; and
wherein the controller is configured to control the first plurality of switches, the second plurality of switches, the third plurality of switches, and the linear amplifier in order to generate the load voltage as a function of an input signal to the controller.

16. The switching power stage of claim 15, wherein the controller is further configured to control the second plurality of switches and the third plurality of switches in order to generate a desired polarity of the load voltage.

17. The switching power stage of claim 15, wherein the second plurality of switches are integral to a final output stage of a differential amplifier.

18. The switching power stage of claim 15, wherein the third plurality of switches are integral to a final output stage of a differential amplifier.

19. The switching power stage of claim 15, wherein the second plurality of switches and the third plurality of switches are integral to a final output stage of a differential amplifier.

20. The switching power stage of claim 15, wherein the controller further controls the linear amplifier to drive a non-zero voltage at the linear amplifier output terminal in order to increase a common mode voltage of the first load terminal and the second load terminal when the voltage of the power converter output terminal is driven to the lower saturation limit in order to produce the output voltage as a function of the input signal while minimizing non-linearities of the output voltage as a function of the input signal.

21. The switching power stage of claim 15, wherein the controller further controls the linear amplifier to drive a voltage at the linear amplifier output terminal as a function of a target output voltage which is a function of the input signal.

22. A method for producing a load voltage at a load output of a switching power stage, the load output comprising a first load terminal having a first load voltage and a second load terminal having a second load voltage such that the load voltage comprises a difference between the first load voltage and the second load voltage, the switching power stage further comprising a power converter comprising a power inductor and a first plurality of switches, wherein the power converter is configured to drive a power converter output terminal coupled to the first load terminal in order to drive the first load terminal, wherein the first plurality of switches comprises a first switch coupled between a second terminal of the power inductor and the power converter output terminal and a second switch coupled between the second terminal of the power inductor and a second supply terminal, and wherein a capacitor is coupled between the first load terminal and one of a first supply terminal having a first voltage and a second supply terminal having a second voltage, the switching power stage further comprising a linear amplifier configured to drive a linear amplifier output terminal coupled to the second load terminal in order to drive the second load terminal, the method comprising:
controlling the first plurality of switches of the power converter and the linear amplifier in order to generate the load voltage as a function of an input signal to a controller such that energy delivered to the load output is supplied predominantly by the power converter.

23. The method of claim 22, wherein a second terminal of the power inductor is coupled to the power converter output terminal.

24. The method of claim 22, wherein a capacitor is coupled between the first load terminal and the second load terminal.

25. The method of claim 22, wherein the first plurality of switches comprises:
a first switch coupled between a first terminal of the power inductor and a first supply terminal having a first voltage; and
a second switch coupled between the first terminal of the power inductor and a second supply terminal having a second voltage.

26. The method of claim 25, wherein the first plurality of switches further comprises:
a third switch coupled between a second terminal of the power inductor and the power converter output terminal; and
a fourth switch coupled between the second terminal of the power inductor and the second supply terminal.

27. The method of claim 22, further comprising the first plurality of switches to drive the first load voltage as a function of a target output voltage which is a function of the input signal.

28. The method of claim 27, wherein the function of the target output voltage includes a magnitude of the target output voltage.

29. The method of claim 27, wherein the function of the target output voltage includes a lower saturation limit of the power converter output terminal.

30. The method of claim 27, further comprising controlling the linear amplifier to drive a non-zero voltage as the second load voltage in order to increase a common mode voltage of the first load terminal and the second load terminal when the power converter output terminal is driven to the lower saturation limit in order to produce the output voltage as a function of an input signal to the controller while minimizing non-linearities of the output voltage as a function of the input signal.

31. The method of claim 22, further comprising controlling the linear amplifier to drive the second load voltage as a function of a target output voltage which is a function of the input signal.

32. The method of claim 22, wherein the switching power stage comprises a second plurality of switches, comprising at least a first switch coupled between the power converter output terminal and the first load terminal and a second switch coupled between the power converter output terminal and the second load terminal such that the power converter output terminal and the first load terminal are coupled via the first switch and the power converter output terminal and the second load terminal are coupled via the second switch, and the method further comprises controlling the first plurality of switches, the second plurality of switches, and the linear amplifier in order to generate the load voltage as a function of an input signal to the controller such that energy delivered to the load output is supplied predominantly by the power converter.

33. The method of claim 32, wherein the switching power stage further comprises a second linear amplifier configured to drive the first load terminal.

34. The method of claim 33, further comprising controlling the linear amplifier and the second linear amplifier such that:
when the linear amplifier drives the second load terminal, the second linear amplifier is prevented from driving the first load terminal; and
when the second linear amplifier drives the first load terminal, the linear amplifier is prevented from driving the second load terminal.

35. The method of claim 33, further comprising controlling the second linear amplifier to drive a non-zero voltage as the first load voltage in order to increase a common mode voltage of the first load terminal and the second load terminal when the voltage of the power converter output terminal is driven to the lower saturation limit in order to produce the output voltage as a function of the input signal while minimizing non-linearities of the output voltage as a function of the input signal.

36. The method of claim 32, wherein the switching power stage further comprises a third plurality of switches, comprising at least a third switch coupled between the linear amplifier output terminal and the first load terminal and a fourth switch coupled between the linear amplifier output terminal and the second load terminal such that the linear amplifier output terminal and the first load terminal are coupled via the third switch and the linear amplifier output terminal and the second load terminal are coupled via the fourth switch, further comprising controlling the first plurality of switches, the second plurality of switches, the third plurality of switches, and the linear amplifier in order to generate the load voltage as a function of an input signal to the controller.

37. The method of claim 36, further comprising controlling the second plurality of switches and the third plurality of switches in order to generate a desired polarity of the load voltage.

38. The method of claim 36, wherein the second plurality of switches are integral to a final output stage of a differential amplifier.

39. The method of claim 36, wherein the third plurality of switches are integral to a final output stage of a differential amplifier.

40. The method of claim 36, wherein the second plurality of switches and the third plurality of switches are integral to a final output stage of a differential amplifier.

41. The method of claim 36, further comprising controlling the linear amplifier to drive a non-zero voltage at the linear amplifier output terminal in order to increase a common mode voltage of the first load terminal and the second load terminal when the voltage of the power converter output terminal is driven to the lower saturation limit in order to produce the output voltage as a function of the input signal while minimizing non-linearities of the output voltage as a function of the input signal.

42. The method of claim 36, further comprising controlling the linear amplifier to drive a voltage at the linear amplifier output terminal as a function of a target output voltage which is a function of the input signal.

* * * * *

UNITED STATES PATENT AND TRADEMARK OFFICE
CERTIFICATE OF CORRECTION

PATENT NO. : 9,985,587 B2
APPLICATION NO. : 15/168680
DATED : May 29, 2018
INVENTOR(S) : He et al.

It is certified that error appears in the above-identified patent and that said Letters Patent is hereby corrected as shown below:

In the Specification

Beginning at Line 58 of Column 7 should be corrected to read:

$V_{PC} = V_{TGT}$; for $|V_{TGT}| > V_{SAT}$
$V_{PC} = V_{SAT}$; for $|V_{TGT}| \leq V_{SAT}$ $V_{AMP} = 0$; for $V_{TGT} > V_{SAT}$
$V_{AMP} = V_{SAT} - V_{TGT}$; for $0 \leq V_{TGT} \leq V_{SAT}$
$V_{AMP} = $ no drive; for $V_{TGT} < 0$ $V_{AMP}' = 0$; for $V_{TGT} < -V_{SAT}$
$V_{AMP}' = V_{SAT} + V_{TGT}$; for $-V_{SAT} \leq V_{TGT} \leq 0$
$V_{AMP}' = $ no drive; for $V_{TGT} > 0$ Signed and Sealed this
Nineteenth Day of February, 2019

Andrei Iancu
*Director of the United States Patent and Trademark Office*